US008008682B2

(12) United States Patent
Liaw et al.

(10) Patent No.: US 8,008,682 B2
(45) Date of Patent: Aug. 30, 2011

(54) ALUMINA SUBSTRATE AND METHOD OF MAKING AN ALUMINA SUBSTRATE

(75) Inventors: Been Yu Liaw, Hong Kong (CN); Ming Lu, Hong Kong (CN)

(73) Assignee: Hong Kong Applied Science and Technology Research Institute Co. Ltd., Hong Kong, Hong Kong (CN)

( * ) Notice: Subject to any disclaimer, the term of this patent is extended or adjusted under 35 U.S.C. 154(b) by 466 days.

(21) Appl. No.: 12/062,637

(22) Filed: Apr. 4, 2008

(65) Prior Publication Data

US 2009/0252950 A1 Oct. 8, 2009

(51) Int. Cl.
*H01L 33/00* (2010.01)
(52) U.S. Cl. .................................. 257/99; 257/E33.058
(58) Field of Classification Search ............... 428/319.1, 428/220; 430/326; 257/99, 706, E33.058, 257/276, 668, E27.001
See application file for complete search history.

(56) References Cited

U.S. PATENT DOCUMENTS

| | | | | |
|---|---|---|---|---|
| 6,528,732 | B1 * | 3/2003 | Okubora et al. | 174/255 |
| 6,670,704 | B1 * | 12/2003 | Neftin et al. | 257/696 |
| 2002/0012780 | A1 * | 1/2002 | Yuyama et al. | 428/216 |
| 2004/0178000 | A1 * | 9/2004 | Tseng | 174/264 |
| 2005/0225222 | A1 * | 10/2005 | Mazzochette et al. | 313/46 |
| 2006/0057866 | A1 * | 3/2006 | Mirsky et al. | 439/66 |
| 2006/0097385 | A1 * | 5/2006 | Negley | 257/722 |
| 2007/0080360 | A1 * | 4/2007 | Mirsky et al. | 257/99 |
| 2007/0262470 | A1 * | 11/2007 | Ichiryu et al. | 257/783 |

OTHER PUBLICATIONS

AZOM Al alloy, 2007, http://www.azom.com/details.asp?ArticleID=310).*

* cited by examiner

*Primary Examiner* — Thomas L Dickey
*Assistant Examiner* — Nikolay Yushin
(74) *Attorney, Agent, or Firm* — Venable LLP; Jeffri A. Kaminski

(57) ABSTRACT

An alumina substrate and method of making an alumina substrate using oxidation is provided. Generally, photoresist masks are used to protect selected areas of an aluminum layer. The unprotected or exposed areas of the aluminum layer are then oxidized during a photolithography process. The protected, unexposed areas of the aluminum layer retain their conductive properties while the oxidized areas are converted to alumina, or aluminum oxide, which is non-conductive. Accordingly, an alumina substrate having conductive areas of aluminum is formed. In one embodiment, the alumina substrate includes an alumina layer, one or more aluminum vias formed within the alumina layer, each of the one or more aluminum vias extending between the bottom of the alumina layer and the top of the alumina layer, wherein the one or more aluminum vias are integrally formed within the alumina layer.

12 Claims, 6 Drawing Sheets

US 8,008,682 B2

ALUMINA SUBSTRATE AND METHOD OF MAKING AN ALUMINA SUBSTRATE

FIELD OF THE INVENTION

The present invention relates to an alumina substrate, and more particularly, to a method of making an alumina substrate using oxidation.

BACKGROUND OF THE INVENTION

Methods of forming a substrate carrier is presently know in the semiconductor field. One such conventional method involves forming holes into layers of a dielectric material using any desired method, such as drilling or a laser via process, and then plating the holes with a conductive material to form a conductive interconnection between the layers. Substrates formed using this process may be limited to only certain limited applications, such as those using non-flexible substrates. Also, the size of interconnections are limited by the hole forming and plating process. Additionally, plating processes can result in reliability problems and result in poor quality in the connections and transmissions of electrical signals.

Accordingly, there is a need for an alumina substrate and a method of making an alumina substrate that solves these and other shortcomings of know fabrication methods.

SUMMARY OF THE INVENTION

According to one embodiment of the present invention, an alumina substrate is disclosed. The alumina substrate includes an alumina layer having a first surface and a second surface; and one or more aluminum vias formed within the alumina layer, each of the one or more aluminum vias extending between the first surface of the alumina layer and the second surface of the alumina layer, each of the plurality of aluminum vias further having a first pad at the first surface of the alumina layer and a second pad at the second surface of the alumina layer; wherein the one or more aluminum vias are integrally formed in the alumina layer.

According to another embodiment, a method of making an alumina substrate using oxidation is disclosed. The method includes providing an aluminum layer, the aluminum layer having a first surface and a second surface; applying a photoresist mask to at least one of the first surface and the second surface of the aluminum layer, wherein the photoresist mask exposes at least part of the aluminum layer; using a photolithography process to oxidize the exposed layers of the aluminum layer, wherein the photolithography process creates one or more aluminum vias from the aluminum layer; and removing the photoresist mask.

According to another embodiment, a method of making an alumina substrate using oxidation is disclosed. The method includes providing an aluminum layer, the aluminum layer having a first surface and a second surface; applying a first photoresist to the first surface of the aluminum layer; applying a second photoresist to the second surface of the aluminum layer; forming a first photoresist mask pattern in the first photoresist to create an exposed area on the first surface of the aluminum layer; forming a second photoresist mask pattern in the second photoresist to create an exposed area on the second surface of the aluminum layer; exposing each of the first surface and the second surface of the aluminum layer using photolithography for a first predetermined amount of time to oxidize the exposed area on the first and second surfaces of the aluminum layer, wherein at least part of the exposed area on the first surface and at least part of the exposed area on the second surface are converted to alumina; and removing the first photoresist and the second photoresist from the aluminum layer.

Still other embodiments of the present invention will become readily apparent to those skilled in the art from the following detailed description, wherein embodiments of the invention are described by way of illustration. As will be realized, the invention is capable of other and different embodiments and its several details are capable of modifications in various respects, all without departing from the spirit and the scope of the present invention.

DETAILED DESCRIPTION

In the following description, reference is made to the accompanying drawings where, by way of illustration, specific embodiments of the invention are shown. It is to be understood that other embodiments may be used as structural and other changes may be made without departing from the scope of the present invention. Also, the various embodiments and aspects from each of the various embodiments may be used in any suitable combinations. Accordingly, the drawings and detailed description are to be regarded as illustrative in nature and not as restrictive.

Generally, the present invention is directed to an alumina substrate and method of making an alumina substrate using oxidation. Generally, photoresist masks are used to protect selected areas of an aluminum layer. The unprotected or exposed areas of the aluminum layer are then oxidized during a photolithography process. The protected, unexposed areas of the aluminum layer retain their conductive properties while the oxidized areas are converted to alumina, or aluminum oxide, which is non-conductive. Accordingly, an alumina substrate having conductive areas of aluminum is formed. Such an alumina substrate addresses the shortcomings of existing substrates. Those skilled in the art will appreciate that a substrate having any desired substrate design, configuration, and number of connections may be achieved according to embodiments of the present invention described in the present application.

Figure 1:
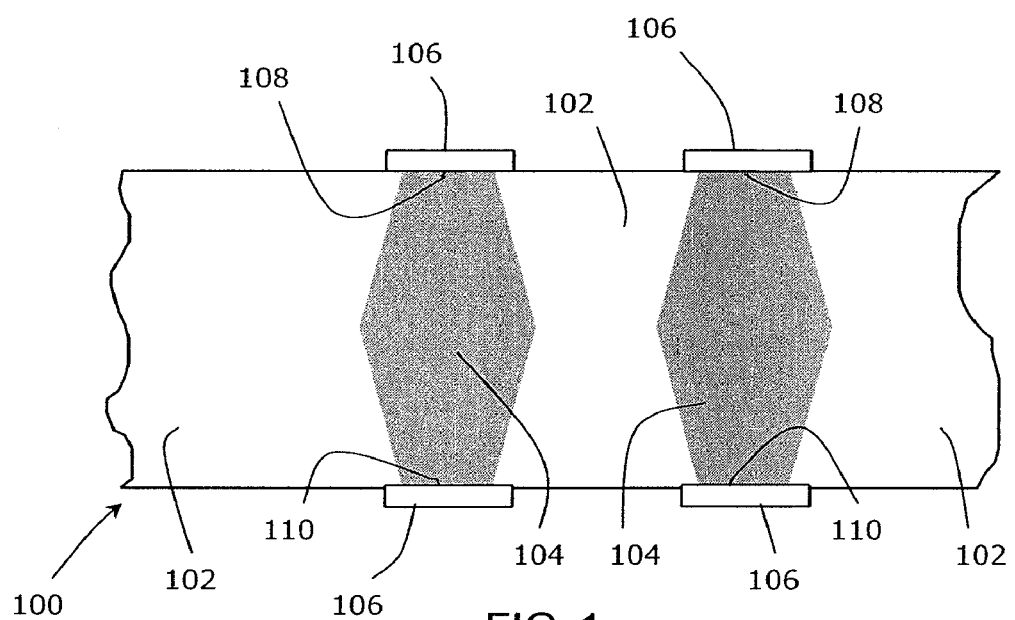
FIG. 1 is a cross-sectional view of an alumina substrate, according to an embodiment of the present invention.

Referring to FIG. 1, a cross-sectional view of an alumina substrate, according to an embodiment of the present invention, is shown. The alumina substrate 100 has alumina ($Al_2O_3$) areas 102 and aluminum vias 104 that extend across the full thickness of the substrate 100. Photoresist masks 106 are located on the top and bottom of the substrate 100 to illustrate the formation of the aluminum vias 104. However, these masks may be removed to expose top surface pads 108 and bottom surface pads 110 of the aluminum vias 104 and allow further processing and use of the substrate. Also, because the surface pads 108, 110 are created using a photolithography process, the size of the surface pads can be very small, or any size as required by the particular application.

As used to describe embodiments of the present invention, the term "via" is used to describe the aluminum connection that is integrally formed in the substrate. While the term "via" can sometimes generally be used to mean "a hole", in embodiments of the present invention, it is not necessary to form holes or passages in the substrate. Accordingly, the term "via" as used with embodiments of the present invention refers to the conductive portion of the substrate that has not been converted to alumina and is conductive through the thickness of the substrate.

Figure 2:
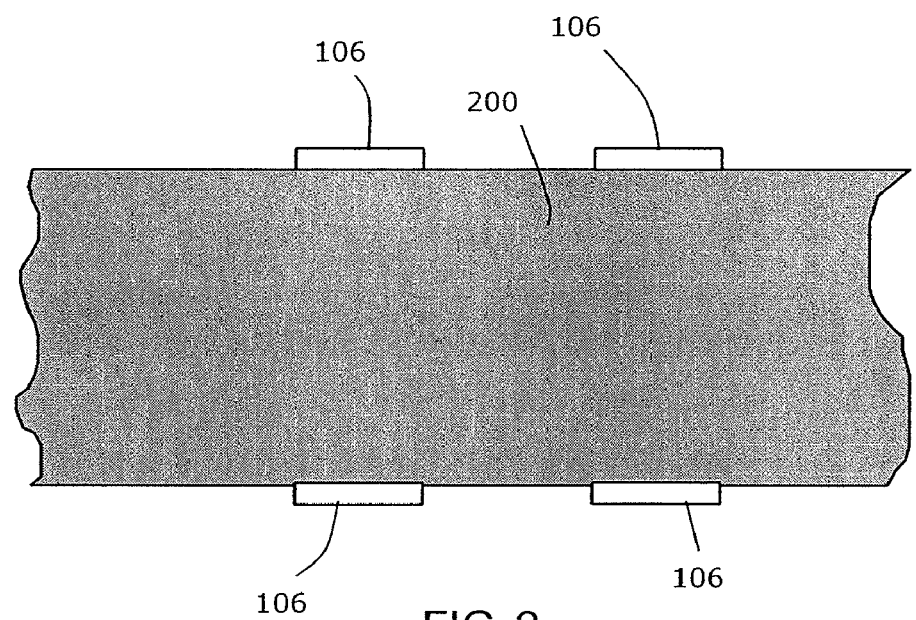
FIG. 2 is a cross-sectional view of the alumina substrate of FIG. 1, prior to an oxidation process, according to an embodiment of the present invention.

Referring now to FIG. 2, a cross-sectional view of the alumina substrate of FIG. 1, prior to an oxidation process, is shown to illustrate the making of the alumina substrate 100 shown in FIG. 1. The alumina substrate 100 is formed from a base material of an aluminum sheet 200, or aluminum thin sheet. In one embodiment the aluminum sheet 200 is formed from an aluminum alloy such as, for example, aluminum (Al) 6063. However, other aluminum alloys may be used, and material having similar properties may be used. For example, Al 5053, Al 1050, and Al 5051 are other example alloys suitable for use with embodiments of the present invention. However, the present invention should not be limited solely to these example materials.

The plurality of masks 106 are placed on the aluminum sheet on both the top and bottom of the aluminum sheet 200. In the embodiment illustrated in FIGS. 1 and 2, the masks are generally vertically aligned so that the aluminum vias 104 are formed generally vertically through the alumina substrate 100. However, as described with reference to FIGS. 3 and 4A through 4D, offset vias and internal aluminum layers maybe be formed using masks, as desired by particular design requirements.

A photoresist material is applied to both the top and bottom of the aluminum sheet 200. Photoresist masks are then formed on the top and bottom of the aluminum sheet 200, and the aluminum sheet 200 is exposed from the top and the bottom using a photolithography oxidation process. The areas of the aluminum sheet 200 below and above the photoresist masks 106 are protected from the oxidation process so that these protected areas of the aluminum sheet 200 maintain their aluminum properties while the unprotected areas that are exposed to the oxidation are converted to alumina, and become the alumina areas 102 shown in FIG. 1.

Since aluminum is a conductor and alumina is non-conducting, the conducting aluminum vias 104 are limited to the area of the substrate 100 that have not been oxidized. Therefore, other chips, components or structures may be connected to the top pads 108 and the bottom pads 110 of the aluminum vias 104 as required by the particular application. One advantage of embodiments of the present invention is that no drilling or creation of holes is required and plating is also not required.

After the oxidation process, the alumina substrate 100 comprises an alumina layer having a first surface and a second surface, which may correspond to the top and bottom surfaces of the alumina substrate, and one or more aluminum vias 104 within the alumina layer, extending between the first surface and second surface of the alumina layer. The alumina layer may also include one or more internal layers (described with reference to FIGS. 3 and 4A through 4D). The alumina layer, or alumina substrate, therefore, is not completely formed of alumina but may include both alumina and aluminum areas, and may include other types of materials as well, as required by any desired application.

Figure 3:
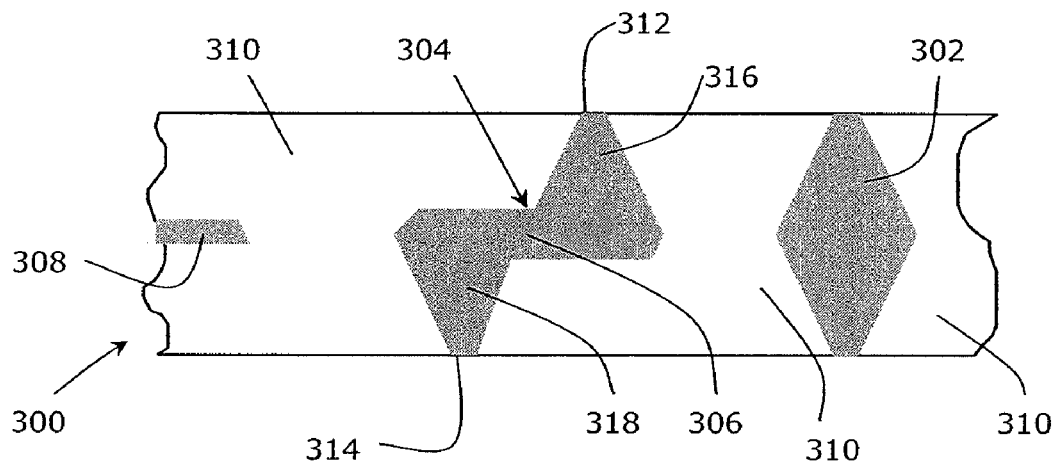
FIG. 3 is a cross-sectional view of an alumina substrate having an internal interconnect layer, according to an embodiment of the present invention.

FIG. 3 is a cross-sectional view of an alumina substrate having an internal layer, according to an embodiment of the present invention. The alumina substrate 300 shown includes an aligned via 302, an offset via 304, an internal interconnect layer 306 that forms a part of the blind aluminum via 304, and an internal layer 308, which may serve as ground/VCC. The remaining areas 310 are alumina, having been fully oxidized during a photoresist process. Having the internal interconnect layer 306 allows a position shift of the top pad 312 from the bottom pad 314 so that the top pad 312 is not directly aligned with the bottom pad. The offset via 304 thereby has a top aluminum via 316 is offset from a bottom aluminum via 318. Allowing such a position shift of the top and bottom pads can be important in the circuit layout as it provides flexibility in for placing electronic components and connections. Such an offset via may also be referred to as a blind via. The internal layer 308 does not necessarily have a connection to either the top or the bottom of the alumina substrate 300 and therefore may serve as a ground or a VCC layer.

By controlling of the oxidation process so as to not fully oxidize the entire thickness of the aluminum material, a center part of the aluminum material may be left with conducting properties of the aluminum. A longer exposure is required to change the aluminum material fully to alumina and a shorter exposure is required to leave some area with conductive properties. Therefore, to create an alumina substrate similar to the alumina substrate 300 shown in FIG. 3, with some areas fully penetrated and some areas leaving a center, internal having conductive material, two photoresist processes are used.

One combination of an aligned aluminum via 302, an offset aluminum via 304, and an internal ground layer 308 is shown in FIG. 3 for the purpose of illustration. It will be appreciated that any combination of these structures may be combined in any number and position to meet any particular design requirements.

Figure 4A:
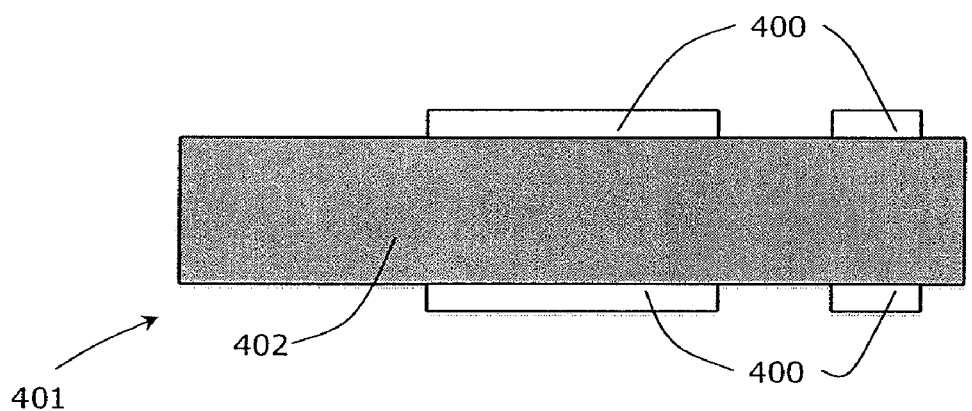
FIGS. 4A to 4D illustrate the process for making the alumina substrate shown in FIG. 3, according to an embodiment of the present invention.

FIGS. 4A to 4D illustrate the process for making the alumina substrate shown in FIG. 3, according to an embodiment of the present invention. Referring to FIG. 4A, a first set of masks 400 are applied to a substrate 401 that is initially an aluminum sheet 402. Then, both the top and the bottom of the aluminum sheet 402 are exposed during a photolithography process to oxidize the areas of the aluminum sheet 402 that are not protected by the first set of masks 400.

Figure 4B:
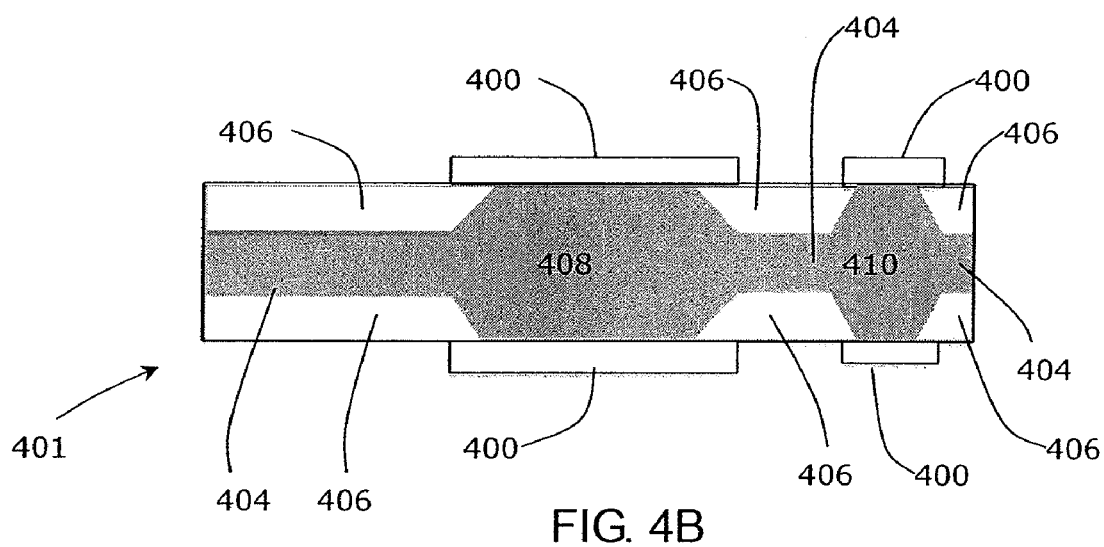
Figure 4C:
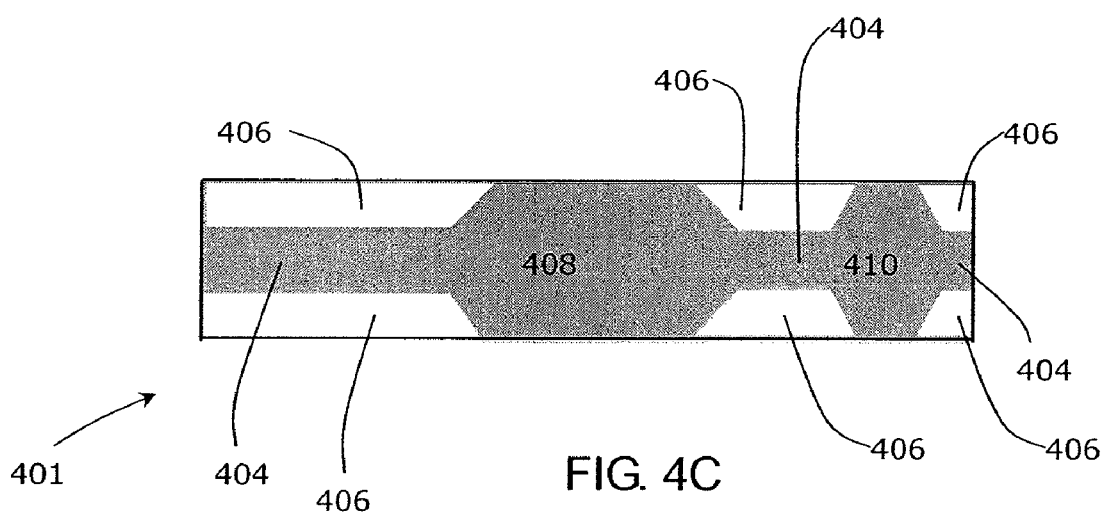

Referring now to FIGS. 4B and 4C, the substrate 401 is exposed for a predetermined amount of time so that the exposed areas of the aluminum sheet are not fully oxidized. Instead, the predetermined amount of time is such that center portions 404 of the substrate 401 are left as the original aluminum material, while alumina areas 406 are created in other parts of the substrate 401. A first aluminum via 408 and a second aluminum via 410 are created in the area protected by the first set of masks 400. In FIG. 4C, the first set of masks 400 have been removed to prepare for the next step in the process.

Figure 4D:
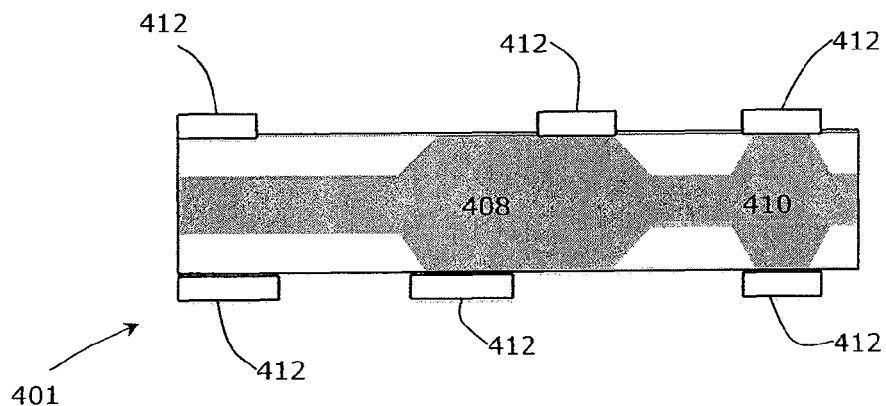

Referring to FIG. 4D, a second set of masks 412 is applied to the substrate. Where the first set of masks 400 were vertically aligned, a pair of the second set of masks 412 adjacent to the first aluminum via 408 are vertically offset in order to change the first aluminum via into an offset via. After the second set of masks 412 are applied, the substrate 401 is exposed on both sides for a second predetermined amount of time. The second predetermined amount of time is such that (a) some sections of the substrate 401 are fully converted into alumina, and (b) some sections of the first aluminum via 408 are not fully converted into alumina. After the second predetermined amount of time, the substrate takes the form shown in FIG. 3. The second set of masks 412 may then be removed for further processing.

Figure 5:
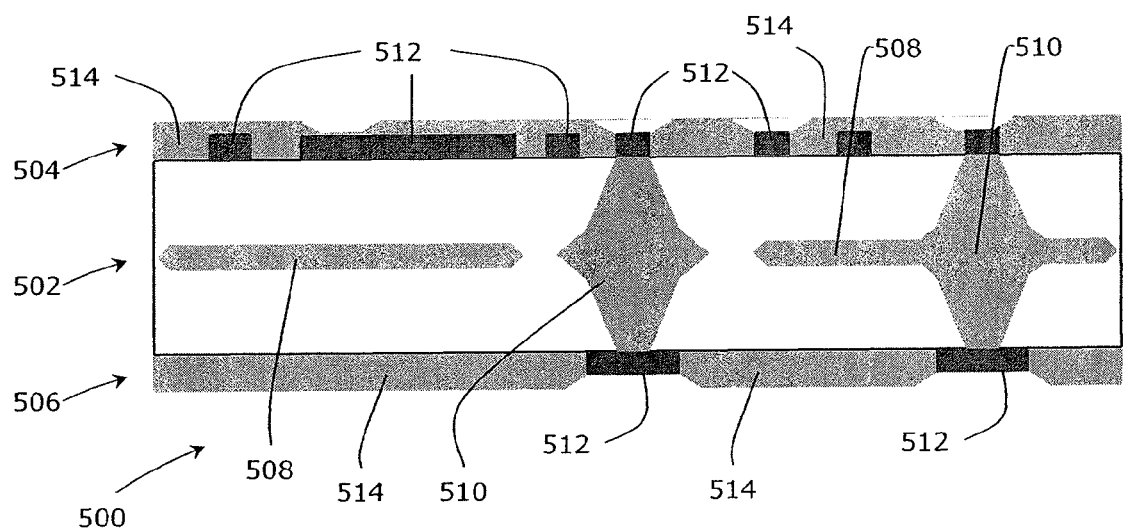
FIG. 5 is a cross-sectional view of a core structure, according to an embodiment of the present invention.

FIG. 5 is a cross-sectional view of a core structure, according to an embodiment of the present invention. The core structure 500 generally includes a three-layer structure made up of an alumina substrate 502 formed using the processes described with reference to FIGS. 1 to 3 and 4A to 4D, a top connection layer 504, and a bottom connection layer 506. The alumina substrate 502, similar to the alumina substrate 300 of FIG. 3, has internal aluminum layers 508 and aluminum vias 510.

The top connection layer 504 and the bottom connection layer 506 include a combination of copper metallization 512 and solder masks 514. In one embodiment, the top connection layer 504 and the bottom connection layer 506 are formed on the alumina substrate 502 by lamination. However, other fabrication methods may be used to form the top and bottom connection layers 504, 506. The copper metallization 512 allows for a circuit to be built on both the top and bottom of the core structure 500, the core structure including the alumina substrate 502. For example, in the illustrated embodiment, the copper metallization 512 is applied to the top and bottom pads of the aluminum vias 510.

Figure 6:
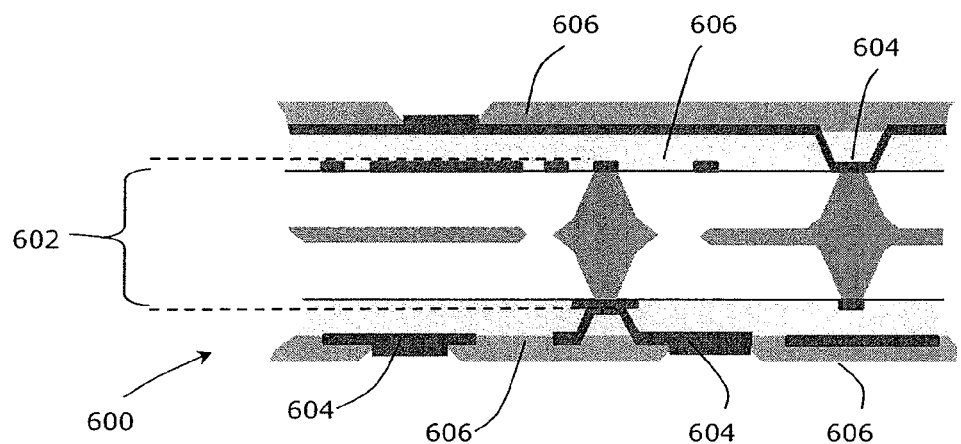
FIG. 6 is a cross-sectional view of a multi-layer alumina substrate structure formed using a build up method, according to an embodiment of the present invention.

FIG. 6 is a cross-sectional view of a multi-layer alumina substrate structure 600 formed using a build up method, according to an embodiment of the present invention. The multi-layer alumina substrate structure 600 includes a core structure 602, which is formed according to the method described with reference to FIG. 5. A circuit may be built both on the top and bottom of the core structure 602 by way of spin-coating additional layers, such as metal plating 604 and solder layers 606, to the core structure 602, thereby forming the multi-layer alumina substrate structure 600.

Figure 7:
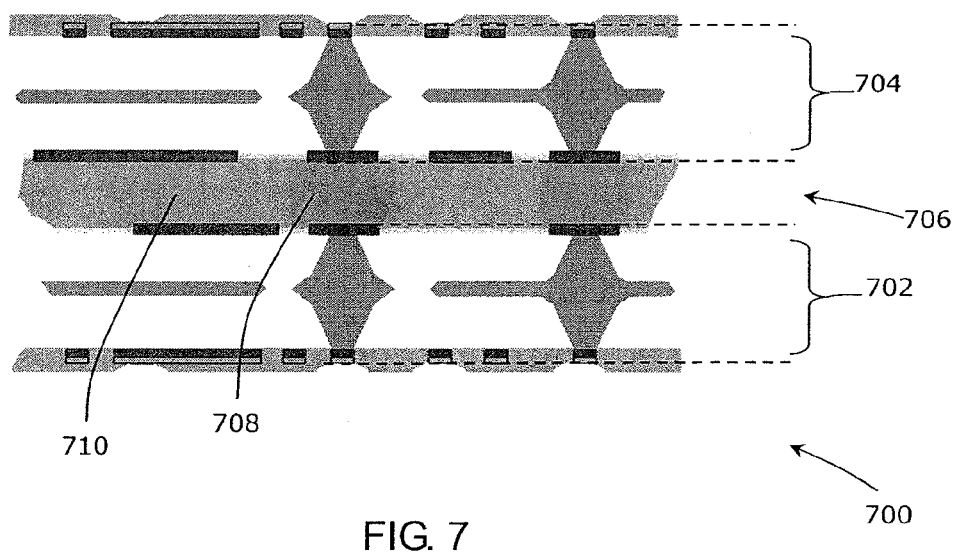
FIG. 7 is a cross-sectional view of a multi-layer alumina substrate structure formed using a stacking method, according to an embodiment of the present invention.

FIG. 7 is a cross-sectional view of a multi-layer alumina substrate structure formed using a stacking method, according to an embodiment of the present invention. The multi-layer alumina substrate structure 700 includes a first core structure 702 and a second core structure 704 joined by a connection layer 706, which may be the printed circuit board (PCB) having PCB structures 708, 710. In one embodiment, the printed circuit board is formed using conventional methods, being a two-layer circuit. Then, two substrate structures are laminated on the PCB, one on each side, to form build-up layers. The first core structure 702 and the second core structure 704 may each be formed according to the method described with reference to FIG. 5.

As shown in the illustrated embodiment of FIG. 7, a circuit may be built both on the top and bottom of the first core structure 702 and the second core structure 704 by way of lamination to make the multi-layer alumina substrate structure 700. While the illustrated embodiment shows the joining of two core structures, lamination may be used to build a circuit on the top and/or bottom of a single core structure, or to join any desired number of core structures as needed by design requirements.

Referring especially to FIGS. 6 and 7, since the core structure is completely formed from aluminum, being either aluminum vias or sections that have been converted into alumina, the core structure exhibits good conductivity. Therefore, in one application, the core structure may be used as a heat sink so that heat is dumped into the core structure. Also, a circuit including typical semiconductor materials, such as flame retardant 4 (FR4) or dielectric materials, which do not have good conductive properties, may be built onto the core structure, which has good conductivity. Also, while embodiments show the use one core and two core structures, any number of core structures may be used according to the particular design requirements.

Figure 8:
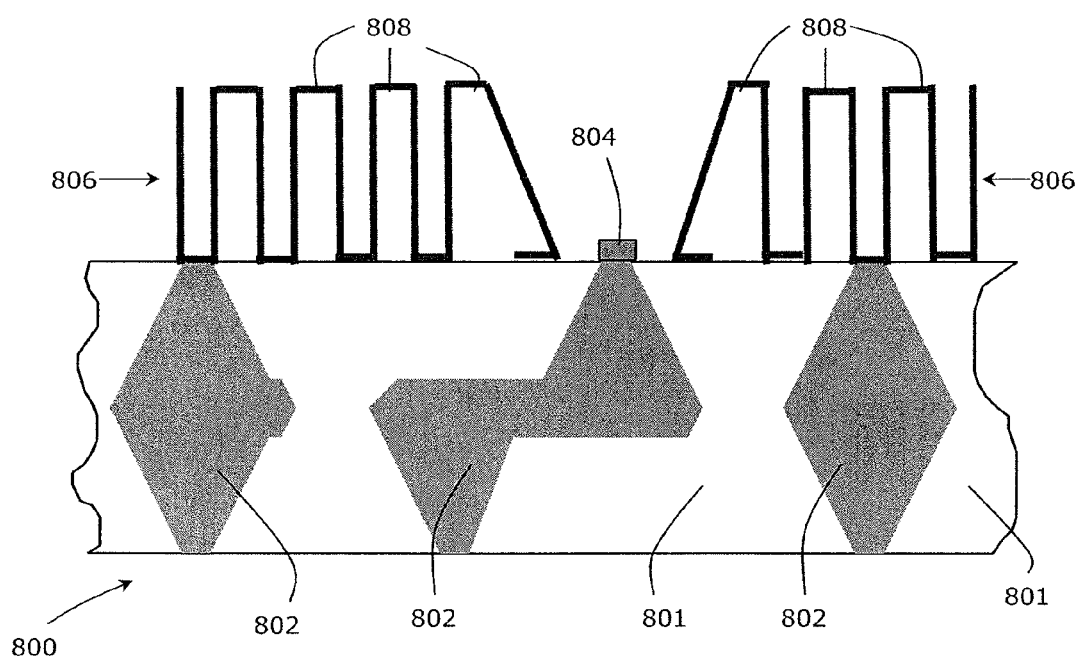
FIG. 8 is a cross-sectional of an alumina substrate used in an LED application, according to an embodiment of the present invention.

FIG. 8 is a cross-sectional of an alumina substrate used in a light emitting diode (LED) application, according to an embodiment of the present invention. An LED structure 800 includes an alumina substrate 801 having a plurality of conductive vias 802, a light emitting diode 804, and a reflector 806.

The embodiment illustrated in FIG. 8 is directed to an application for LED packaging. LED packaging generally intends to solve the thermal problem of heat generation, and since the aluminum/alumina material provides good conductivity, the thermal problem may be addressed. LED packaging also may consider light reflection, because an LED is a lighting device and the light generated by the LED should be able to reflect outward so that it generates light output.

In one embodiment, the reflector 806 is formed from aluminum foil and serves to reflect the light generated from the light emitting diode 804 and also acts as a thermal wing, or heat exchange. The aluminum foil of the reflector 806 may be shaped into a plurality of fin-structures 808 to increase the overall surface area of the aluminum foil and allow for greater dispersion of heat into the air. The bottom portion of the fin-structures 808 contacts the alumina substrate 801. Because the alumina substrate 801 is a good conductor, the heat generated by the light emitting diode 804 is transferred into the alumina substrate. Since the fin-structures 808 are connected to the alumina substrate 801, the heat is transferred to the plurality of fin structures 808 where the heat may be dispersed into the air. A top-down view of the reflector 806 would have a circular, or ball-shaped appearance, with the reflector surrounding the light emitting diode 804 at the center of the reflector 806. While one embodiment of the reflector 806 is formed from aluminum, other materials may be used that similarly disperse heat.

One advantage of embodiments of the present application used in LED fabrication is that it addresses the problem of heat generated by the LED. One other advantage is that embodiments of the present invention extend the operating range from approximately 3 watts, used in some conventional LED, up to, for example, approximately 8 to 10 watts without the thermal wing and approximately 12 to 15 watts with the thermal wing. These ranges can be achieved without use of an external heat sink or enhanced packaging. Other operating ranges may be used and embodiments of the present invention are not necessarily limited to these operating ranges.

Additionally, in embodiments of the present invention, thermal conductivity is also improved when compared with a bismaleimide triazine (BT) or ceramic substrate. There is also no need to use high temperatures when making an alumina substrate, according to embodiments of the present invention. Embodiments of the present invention may also be used with large area panel (LAP) designs and thin structures, providing for increased flexibility in the possible applications.

In one embodiment, the aluminum foil may be coated with a reflective material, such as silver or any other suitable material, to increase the reflective property of the reflector 806.

While the invention has been particularly shown and described with reference to the illustrated embodiments, those skilled in the art will understand that changes in form and detail may be made without departing from the spirit and scope of the invention. For example, while embodiments of the present invention may be used for LED fabrication, embodiments of the present invention may also be used for any integrated circuit fabrication, semiconductor design, or other LED applications.

Also, while certain shapes and configurations of aluminum vias and internal layers in the alumina substrate have been illustrated, it will be apparent that the methods of the present invention can be used to form aluminum vias in any shape, size, number, or configuration according to the particular design requirements.

While embodiments of the substrate have been described with reference to alumina and aluminum, material other than aluminum having similar properties may also be used. Also, while various specific types of metals and materials have been identified, it will be appreciated that certain embodiments of the invention are not limited to these materials and may include materials having similar properties and performing a similar function.

Also, while certain etching and photolithography method have been described, it will be appreciated that other suitable methods may be used without departing from the scope of the invention. Accordingly, the above description is intended to provide example embodiments of the present invention, and the scope of the present invention is not to be limited by these specific examples provided.

What is claimed is:

1. An alumina substrate comprising:
   an alumina layer having a first surface and a second surface;
   one or more aluminum vias formed within the alumina layer, each of the one or more aluminum vias extending between the first surface of the alumina layer and the second surface of the alumina layer, each of the plurality of aluminum vias further having a first pad at the first surface of the alumina layer and a second pad at the second surface of the alumina layer, wherein the one or more aluminum vias are integrally formed in the alumina layer;
   a light emitting diode (LED) coupled to the first pad of one of the plurality of aluminum vias;
   a reflector coupled to the first surface of the alumina layer, wherein the reflector has a fin structure having a first surface coupling the alumina layer and a second surface opposite to the first surface, the fin structure including a plurality of fins on both the first and second surfaces thereof
   an additional alumina layer having a first surface and a second surface, wherein the additional alumina layer has a similar structure as the alumina layer; and
   a printed circuit board (PCB) coupled between the second surface of the alumina layer and the first surface of the additional alumina layer to form build-up layers.

2. The alumina substrate of claim 1, wherein at least part of the alumina layer is alumina and part of alumina layer is aluminum, wherein alumina parts of the alumina layer are oxidized aluminum.

3. The alumina substrate of claim 1, further comprising one or more internal aluminum layers.

4. The alumina substrate of claim 1, wherein at least one of the one or more aluminum vias is an offset via, wherein the first pad of the aluminum via is offset from the second pad of the aluminum via.

5. The alumina substrate of claim 1, further comprising:
   a first metallization layer formed on the first surface of the alumina substrate; and
   a second metallization layer formed on the second surface of the alumina substrate.

6. The alumina substrate of claim 1, wherein the reflector comprises a reflective material configured to reflect light generated by the LED.

7. The alumina substrate of claim 1, wherein the PCB comprises semiconductor materials.

8. The alumina substrate of claim 1, wherein the PCB comprises flame retardant 4 and dielectric materials.

9. The alumina substrate of claim 1, further comprising:
   a plurality of circuits built on the first surface of the alumina layer and the second surface of the additional alumina layer by way of lamination to form multi layers.

10. The alumina substrate of claim 1, wherein the alumina layer is formed from aluminum or an aluminum alloy, wherein the aluminum or aluminum alloy is oxidized into alumina through a photolithography process, and the one or more aluminum vias are protected from oxidization by photoresist masks.

11. The alumina substrate of claim 10, wherein the alumina layer is formed from Al 6063.

12. The alumina substrate of claim 10, wherein the alumina layer is formed from the aluminum alloy selected from a group consisting of Al 5053, Al 1050, and Al 5051.

* * * * *